(12) United States Patent
Inazuki et al.

(10) Patent No.: US 7,622,227 B2
(45) Date of Patent: Nov. 24, 2009

(54) PHASE-SHIFT PHOTOMASK-BLANK, PHASE-SHIFT PHOTOMASK AND FABRICATION METHOD THEREOF

(75) Inventors: Yukio Inazuki, Niigata (JP); Hiroki Yoshikawa, Niigata (JP); Tamotsu Maruyama, Niigata (JP); Satoshi Okazaki, Niigata (JP)

(73) Assignee: Shin-Etsu Chemical Co., Ltd, Tokyo (JP)

( * ) Notice: Subject to any disclaimer, the term of this patent is extended or adjusted under 35 U.S.C. 154(b) by 490 days.

(21) Appl. No.: 11/431,550

(22) Filed: May 11, 2006

(65) Prior Publication Data

US 2006/0257755 A1 Nov. 16, 2006

(30) Foreign Application Priority Data

May 12, 2005 (JP) .............................. 2005-139580

(51) Int. Cl.
*G03F 1/00* (2006.01)
(52) U.S. Cl. .......................................................... 430/5
(58) Field of Classification Search ...................... 430/5
See application file for complete search history.

(56) References Cited

U.S. PATENT DOCUMENTS

| | | | |
|---|---|---|---|
| 5,629,115 A | 5/1997 | Kawano et al. | |
| 6,709,791 B1 | 3/2004 | Mohri et al. | |
| 2004/0191646 A1 | 9/2004 | Yoshikawa et al. | |
| 2004/0197679 A1 | 10/2004 | Yoshikawa et al. | |
| 2005/0112477 A1 | 5/2005 | Yoshikawa et al. | |

FOREIGN PATENT DOCUMENTS

| | | |
|---|---|---|
| EP | 1 132 772 A1 | 9/2001 |
| EP | 1 526 405 A2 | 4/2005 |
| JP | 07-140635 | 6/1995 |
| JP | 2003-50453 | 2/2003 |
| JP | 2004-301992 | 10/2004 |
| JP | 2004-301993 | 10/2004 |

*Primary Examiner*—Mark F Huff
*Assistant Examiner*—Jonathan Jelsma
(74) *Attorney, Agent, or Firm*—Finnegan, Henderson, Farabow, Garrett & Dunner LLP

(57) ABSTRACT

On a substrate that is transparent to exposure light, a phase-shift multilayer film including a stack of two layers of a metal silicide compound is formed. A stabilized oxide layer is formed on the surface of the metal silicide compound layer close to the top surface. The layer close to the substrate (the lower layer) of the phase-shift multilayer film is made of a relatively-metal-rich metal silicide compound, and the upper layer is made of a relatively-metal-poor metal silicide compound. The stabilized oxide layer has a metal-poor composition, and the metal content thereof is equal to or less than one third of the metal content of the lower layer. Thus, the stabilized oxide layer is highly chemically stable and has a high chemical resistance.

20 Claims, 9 Drawing Sheets

ArF:T=6%

| | MoSi$_{2.3}$ | Si | Ar | N$_2$ | O$_2$ | d(Å) | d/d$_{tot}$(%) |
|---|---|---|---|---|---|---|---|
| On the side of top surface | 265 | 735 | 5.0 | 50.0 | 0.2 | 350 | 50 |
| | 290 | 710 | 5.0 | 50.0 | 0.3 | 150 | 21 |
| | 315 | 685 | 5.0 | 50.0 | 0.5 | 80 | 11 |
| | 340 | 660 | 5.0 | 50.0 | 1.0 | 60 | 9 |
| On the side of substrate | 365 | 635 | 5.0 | 50.0 | 1.5 | 60 | 9 |
| | (W) | (W) | (SCCM) | (SCCM) | (SCCM) | (Å) | (%) |

FIG.9

KrF:T=6%

| | MoSi$_{2.3}$ | Si | Ar | N$_2$ | O$_2$ | d(Å) | d/d$_{tot}$(%) |
|---|---|---|---|---|---|---|---|
| On the side of top surface | 550 | 450 | 5.0 | 50.0 | 0.2 | 120 | 13 |
| | 600 | 400 | 5.0 | 50.0 | 0.3 | 118 | 13 |
| | 650 | 350 | 5.0 | 50.0 | 0.5 | 250 | 27 |
| | 700 | 300 | 5.0 | 50.0 | 1.0 | 250 | 27 |
| On the side of substrate | 750 | 250 | 5.0 | 50.0 | 2.0 | 200 | 21 |
| | (W) | (W) | (SCCM) | (SCCM) | (SCCM) | (Å) | (%) |

FIG.11

PHASE-SHIFT PHOTOMASK-BLANK, PHASE-SHIFT PHOTOMASK AND FABRICATION METHOD THEREOF

BACKGROUND OF THE INVENTION

1. Field of the Invention

The present invention relates to a photomask technique used for fabrication of a semiconductor integrated circuit or the like. In particular, it relates to a half-tone phase-shift mask that has a phase-shift multilayer film to attenuate light of an exposure wavelength, a mask blank used for fabricating the mask, and fabrication methods thereof.

2. Description of the Related Art

Typically, photomasks used in a wide variety of technical fields including manufacture of semiconductor integrated circuits, such as ICs, LSIs and VLSIs, are fabricated by patterning of a photomask blank, which has a transparent substrate and a light shielding film primarily made of chromium. Typically, the light shielding film is patterned by photolithography using ultraviolet rays, an electron beam or the like as an exposure beam.

In order to meet the recent market demand for higher integrating density of semiconductor integrated circuits, finer patterning has become desirable. Conventionally, the finer patterning has been achieved by shortening the exposure wavelength. However, although it can improve the pattern resolution, shortening the exposure wavelength disadvantageously reduces the depth of focus and the process stability and adversely affects the product yield.

One of pattern transfer methods that can avoid such disadvantages is a phase-shift method, which uses a phase-shift mask as a mask for transferring a fine pattern. In practice, the phase shift masks can be generally classified into fully transparent phase-shift masks and half-tone phase-shift masks according to the light transmission characteristics of the phase shifter (phase-shift film). Here, the fully transparent phase-shift mask is a mask whose phase shifter has a light transmittance equal to that of the exposed part of the substrate (that is, a mask that is transparent to light of the exposure wavelength). On the other hand, the half-tone phase-shift mask is a mask whose phase shifter has a light transmittance that is several to several tens percents of that of the exposed part of the substrate.

Among others, the half-tone phase shift mask that has the simplest structure and is the easiest to fabricate is a "single-layer half-tone phase-shift mask" that has a phase shifter composed of a single-layer film. For example, there has been proposed a single-layer half-tone phase-shift mask that has a phase shifter (phase-shift film) made of an MoSi-based material, such as MoSiO and MoSiON, (see Japanese Patent Laid-Open No. 7-140635, for example).

The mask blank (phase-shift mask blank) used for fabricating a phase shift mask is required not only to have predetermined values of optical properties including transmittance, phase difference, reflectance, index of refraction and the like at the exposure wavelength but also to be improved in durability, such as chemical resistance, and be less defective from the view point of fabrication process. However, since the phase shifter of the single-layer half-tone phase-shift mask described above is composed of a single-layer film, setting the optical properties thereof to be desired values uniquely determines the film composition. Therefore, it is difficult to provide a phase shift film that can meet practical requirements of other properties including chemical resistance.

To avoid such a problem, a layer for meeting the requirements of the optical properties and a layer for meeting the requirements of the other properties including chemical resistance can be separately prepared and stacked to form a phase-shift film composed of a multilayer film. However, there has been discovered no film structure or film composition that meets the requirements of the optical properties while achieving a satisfactory chemical resistance.

Furthermore, different film compositions results in different degrees of etching (different etch levels) in the dry etching step of the phase-shift film. Thus, there is a problem that such a difference in etch level leads to reduction of smoothness of the end face (side wall) of the patterned area, which in turn inhibits stable and precise transfer of a fine pattern.

SUMMARY OF THE INVENTION

The present invention has been devised in view of such problems, and an object of the present invention is to provide a phase-shift mask blank that has a high chemical resistance while meeting requirements of optical properties, is improved in smoothness (that is, reduced in roughness) of an end face (side wall) of a patterned part resulting from etching of a phase-shift film, and can stably and precisely transfer a fine pattern, and a phase-shift mask fabricated using the mask blank.

In order to attain the object, the present invention is configured as described below.

A phase-shift mask blank according to the present invention comprises: a phase-shift multilayer film including a stack of n layers made of a metal silicide compound; and a stabilized oxide layer formed at the top surface of the phase-shift multilayer film, in which the differences in metal content and silicon content between an m-th layer from a substrate in the phase-shift multilayer film and an (m+1)-th layer are both equal to or less than 5 mole %, and the metal content of a surface area of the stabilized oxide layer is equal to or less than one third (in molar ratio) of the metal content of a layer containing the largest amount of metal in the phase-shift multilayer film. Here, n is an integer equal to or more than 2, and m is an integer falling within a range of $1 \leq m \leq (n-1)$.

Preferably, the metal silicide compound is any of an oxide, a nitride, a carbide, an oxynitride, an oxycarbide, a nitride carbide or an oxynitride carbide of a metal silicide, and the metal silicide is molybdenum silicide.

In addition, preferably, the surface area of the stabilized oxide layer has a metal content lower than the minimum metal content in the phase-shift multilayer film and an oxygen content higher than the maximum oxygen content in the phase-shift multilayer film, and the lowermost layer in the phase-shift multilayer film has the maximum metal content in the phase-shift multilayer film.

If the phase-shift mask blank is configured as described above, the stabilized oxide layer improves the chemical resistance, and the multilayer stack structure allows desired optical properties to be achieved. That is, the present invention can provide a phase-shift mask blank that has a high chemical resistance while meeting requirements of optical properties.

In addition, a phase-shift mask according to the present invention is formed by patterning the phase-shift multilayer film of the phase-shift mask blank according to the present invention.

A method of fabricating a phase-shift mask blank according to the present invention comprises: a first step of depositing a phase-shift multilayer film including a stack of n layers made of a metal silicide compound on a substrate by sputtering; and a second step of performing an oxidation processing on the top surface of the phase-shift multilayer film to form a stabilized oxide layer, in which the film deposition by sputtering is performed using a plurality of targets of different compositions of a metal and silicon constituting the metal silicide, and the power applied to each of the plurality of targets is determined in such a manner that the differences in metal content and silicon content between an m-th layer from the substrate in the phase-shift multilayer film and an (m+1)-th layer are both equal to or less than 5 mole %, and the powers are equal to or less than 30% of the maximum of the powers applied to the targets, and the oxidation processing is performed in such a manner that the metal content of a surface area of the stabilized oxide layer is equal to or less than one third (in molar ratio) of the metal content of a film containing the largest amount of metal in the phase-shift multilayer film. Here, n is an integer equal to or more than 2, and m is an integer failing within a range of $1 \leq m \leq (n-1)$.

Preferably, a metal silicide target and a silicon target are selected as the plurality of targets, and the metal silicide target contains molybdenum as a metal constituent.

In addition, preferably, the film deposition by sputtering is performed using a sputtering gas containing oxygen or nitrogen, and the oxygen or nitrogen content in the sputtering gas is determined in such a manner that the difference between the content during deposition of an m-th layer from the substrate in the phase-shift multilayer film and the content during deposition of an (m+1)-th layer is 5 mole % or less.

In addition, preferably, the film deposition by sputtering is performed using a sputtering gas containing oxygen, and the oxygen content in the sputtering gas is determined in such a manner that the lowermost layer in the phase-shift multilayer film has the maximum metal content in the phase-shift multilayer film, and the oxidation processing is performed in such a manner that the surface area of the stabilized oxide layer has a metal content lower than the minimum metal content in the phase-shift multilayer film and an oxygen content higher than the maximum oxygen content in the phase-shift multilayer film.

According to the method of fabricating a phase-shift mask blank according to the present invention, the deposition conditions of the layers of the multilayer stack structure constituting the phase-shift film change gradually (stepwise), and each layer is deposited under a fixed condition. Thus, there is provided a phase-shift mask blank that is improved in smoothness of the side wall of the patterned part resulting from etching of the phase-shift film and can stably and precisely transfer a fine pattern.

BRIEF DESCRIPTION OF THE DRAWINGS

FIG. 9 is a table showing a summary of the XPS analysis results;

FIG. 11 is a table showing a summary of the XPS analysis results; and

DETAILED DESCRIPTION OF THE INVENTION

Figure 1:
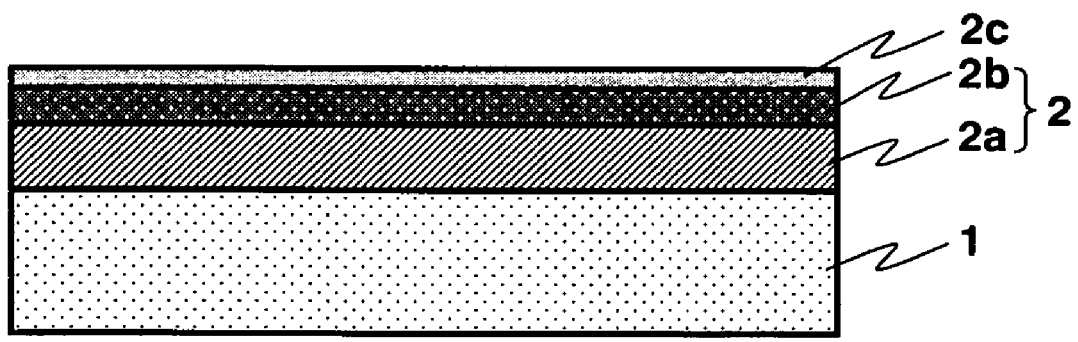
FIG. 1 is a schematic cross-sectional view for illustrating a structure of a phase-shift mask blank according to the present invention.

Through earnest investigation by the inventors, it has been proven that a phase-shift mask blank having a phase-shift film (phase-shift multilayer film) of a multilayer stack structure has an improved chemical resistance if the multilayer stack structure is made of a metal silicide compound, and a stabilized layer is formed on the top surface of the phase-shift multilayer film by oxidizing the metal silicide compound. For more information about such oxidation and stabilization of the phase-shift film surface, see Japanese Patent Laid-Open No. 2003-50453, for example.

The inventors have also known that, if the composition of the phase-shift multilayer film is determined in such a manner that the metal content of the surface area of the stabilized oxide layer is equal to or less than one third (in molar ratio) of the metal content of the layer containing the largest amount of metal in the phase-shift multilayer film, there can be provided a phase-shift mask blank (and a phase-shift mask) that has an improved chemical resistance while meeting the requirements of the optical properties.

That is, the inventors have found that the chemical resistance of the metal silicide compound film increases as the metal content of the film decreases, and the chemical resistance of the metal silicide compound film can be significantly improved by setting the metal content of the metal silicide compound film to be equal to or less than one third of the metal content of the metal silicide compound film composed of a single-layer film to meet the requirements of the optical properties. For this reason, the inventors have decided to form the stabilized oxide layer on the top surface of the phase-shift multilayer film.

In addition, when the phase-shift film having such a composition profile is etched, the etch rate of each layer depends on the composition, and therefore, if two adjacent stacked layers have significantly different compositions, the etch rate suddenly changes at the interface, a remarkable bump is produced, and the roughness of the side wall increases.

Thus, in order to enhance the smoothness of the side wall of the patterned phase-shift film, the layers are ideally deposited in such a manner that the compositions thereof gradually change from the layer adjacent to the substrate (the lowermost layer) to the layer at the top of the phase-shift film (the uppermost layer) (in other words, an infinite number of layers are stacked). In practical, however, it is not easy to stably form a film having such gradations of composition, and the composition profile varies with the film deposition lot, so that the optical property, chemical stability or the like of the film varies.

Thus, according to the present invention, the deposition condition of a plurality of layers of a phase-shift multilayer film is changed gradually (stepwise), and each layer is deposited under a fixed condition.

Specifically, a phase-shift mask blank of the present invention has a phase-shift multilayer film including a stack of n layers made of a metal silicide compound (n is an integer equal to or more than 2) as a phase-shifter, the differences in metal content and silicon content between an m-th layer from a substrate in the multilayer film constituting the phase-shifter and an (m+1)-th layer equal to or less than 5 mole %, and the metal content of a surface area of a stabilized oxide layer formed at the top surface of the multilayer film is equal to or less than one third (in molar ratio) of the metal content of a layer containing the largest amount of metal in said phase-shift multilayer film. Here, m is an integer falling within a range of $1 \leq m \leq (n-1)$.

The term "silicon" as used herein is distinguished from the term "metal". In other words, "metal" as used herein does not include "silicon" unless otherwise specified.

Such a metal silicide compound may be oxide, nitride, carbide, oxynitride, oxycarbide, nitride carbide, oxynitride carbide of a metal silicide, such as molybdenum silicide. For example, MoSiON may be used.

Such a phase-shifter is formed by deposition of a phase-shift multilayer film by sputtering and the following surface oxidation of the phase-shift multilayer film. In the step of film deposition by sputtering, a plurality of targets of different compositions of a metal and silicon constituting said metal silicide (for example, a metal silicide target and a silicon target) are used. And, the composition of each layer in the phase-shift multilayer film is controlled by adjusting the amount of power (applied power) supplied to the targets.

Specifically, the film deposition is performed in such a manner that the power applied to each of the targets is determined so that the differences in metal content and silicon content between an m-th layer from the substrate in the phase-shift multilayer film and an (m+1)-th layer are both equal to or less than 5 mole %, and the powers are equal to or less than 30% of the maximum of the powers applied to the targets. Then, the surface oxidation processing is performed on the phase-shift multilayer film to form a stabilized oxide layer in such a manner that the metal content of a surface area of said stabilized oxide layer is equal to or less than one third (in molar ratio) of the metal content of a layer containing the largest amount of metal in said phase-shift multilayer film.

In the case where MoSiON described above is used as the metal silicide compound, a target containing molybdenum as a metal constituent is used as the metal silicide target, and a gas containing oxygen and nitrogen is used as the sputtering gas. In the case where oxide, nitride or carbide of a metal silicide is used as the metal silicide compound, a gas containing oxygen, nitrogen or carbon is used as the sputtering gas, respectively.

By appropriately changing the contents of oxygen, nitrogen and carbon in the sputtering gas, the metal silicide compound may be oxynitride, oxycarbide, nitride carbide, or oxynitride carbide.

The content of oxygen or nitrogen in the metal silicide compound is adjusted by adjusting the content of oxygen or nitrogen in the sputtering gas. Specifically, the flow rate of oxygen gas or nitrogen gas is adjusted so that the difference between the content of oxygen or nitrogen in the sputtering gas during deposition of an m-th layer from the substrate in said phase-shift multilayer film and the content during deposition of an (m+1)-th layer is 5 mole % or less.

A phase-shifter part of a preferred composition design may have such a composition profile that the surface area of the stabilized oxide layer formed at the top surface of the phase-shift multilayer film has a metal content lower than the minimum metal content in said phase-shift multilayer film and an oxygen content higher than the maximum oxygen content in said phase-shift multilayer film, and the lowermost layer in said phase-shift multilayer film has the maximum metal content in said phase-shift multilayer film.

In such a stack structure, since the surface area of the stabilized oxide layer has the minimum metal content and the maximum oxygen content in the "phase-shift film" composed of the stabilized surface layer and the phase-shift multilayer film, the phase-shifter has a high chemical resistance, and since the lowermost layer in the phase-shift multilayer film has the maximum metal content in the phase-shift multilayer film, the smoothness of the end face (sidewall) of the patterned part is improved.

Patterning such a phase-shift multilayer film can provide a phase-shift mask that has a fine and precise transferred pattern that can be used with a semiconductor integrated circuit that is finer and has a higher integrating density.

As required, a chromium-based light-shielding film, a chromium-based antireflection film, or a film stack of one or more chromium-based light-shielding films and one or more chromium-based antireflection films may be formed on the stabilized oxide layer.

The method of forming the stabilized oxide layer is not limited to a particular one. However, an ozone water processing described in Japanese Patent Laid-Open No. 2003-50453, or a natural oxidation processing of the phase-shift multilayer film surface can be used. Alternatively, instead of using such a special oxidation processing, the flow rate of the oxygen gas may be adjusted during sputtering deposition of the top surface layer of the phase-shift multilayer film to increase the oxygen content of the top surface layer, thereby relatively reducing the metal content of the layer.

In the following, the best mode for carrying out the present invention will be described with reference to the drawings.

FIG. 1 is a schematic cross-sectional view for illustrating a structure of a phase-shift mask blank according to the present invention, in which a phase-shift multilayer film 2 having a stack of two layers of a metal silicide compound (2a, 2b) is formed on a substrate 1. Here, the substrate 1 is made of a material that can transmit exposure light (quartz or $CaF_2$, for example). In the phase-shift multilayer film 2, the layer 2a closer to the substrate 1 (the lower layer) is made of a metal silicide compound of a relatively-metal-rich composition, and the upper layer 2b is made of a metal silicide compound of a relatively-metal-poor composition. As described earlier, the surface of the upper layer 2b is oxidized to form a stabilized oxide layer 2c, and the metal content of the surface area is one third or less (in molar ratio) of the metal content of the lower layer 2a. Such a metal-poor composition provides a high chemical stability and a high chemical resistance.

The metal silicide compound layer of the metal-poor composition (the upper layer 2b) is not enough to provide a phase-shift film having a desired optical property. Thus, according to the present invention, the metal silicide compound layer of a relatively-metal-rich composition (the lower layer 2a) that facilitates control of the optical property is combined with the upper layer 2b, thereby forming a phase-shift multilayer film having a high chemical resistance while meeting the optical property requirement.

Here, the thickness of the stabilized oxide layer (2c) for enhancing the chemical resistance can be 10 Å or more. The phase-shift multilayer film 2 comprising a stack of two layers described above is only illustrative, and the phase-shift multilayer film 2 may be composed of three or more layers stacked.

Figure 2:
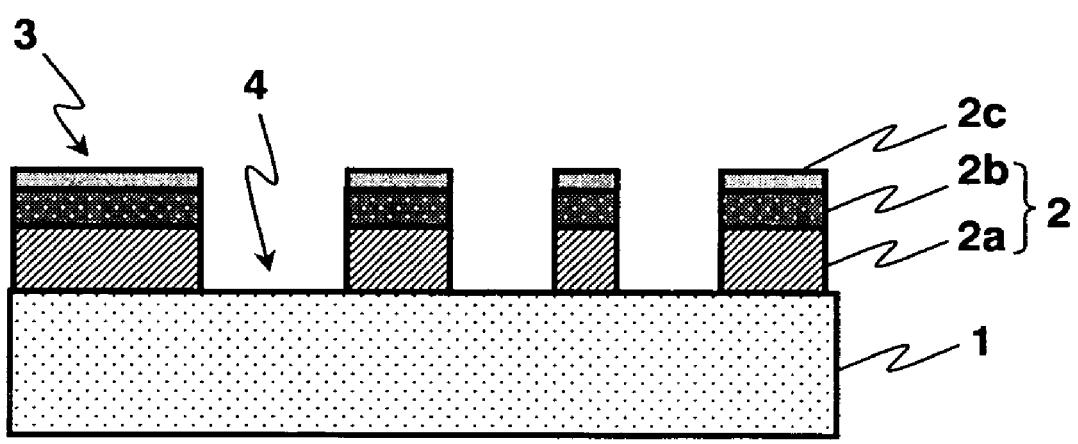
FIG. 2 is a schematic cross-sectional view of a phase-shift mask formed by patterning a phase-shift multilayer film of the phase-shift mask blank according to the present invention.

FIG. 2 is a schematic cross-sectional view of a phase-shift mask formed by patterning the phase-shift multilayer film 2 of the phase-shift mask blank, in which a phase-shifter 3 formed by the patterning and an exposed substrate part 4 resulting from the partial removal of the phase-shift multilayer film 2 by the patterning are arranged in a desired layout. The phase of the light having passed through the phase-shifter 3 is shifted with respect to the phase of the light having passed through the exposed substrate part 4, and the phase shift enhances the contract of the transferred image.

As described above, the phase-shift multilayer film 2 is deposited by sputtering using a sputtering gas containing any of oxygen, nitrogen and carbon, and the number of layers stacked and the composition of each layer are determined to achieve a desired transmittance to the exposure light the and a desired phase difference between the light having passed through the phase-shifter 3 and the light having passed through the exposed substrate part 4. In general, the transmittance falls within a range of several percents to several tens percents and, in many cases, preferably falls within a range of 3 to 40%. The phase difference is designed to be 180 degrees ±5 degrees. According to the present invention, the sputtering may be accomplished using a direct-current power supply or a radio frequency power supply, and a magnetron sputtering, a conventional sputtering or other types of sputtering may be used.

Figure 3:
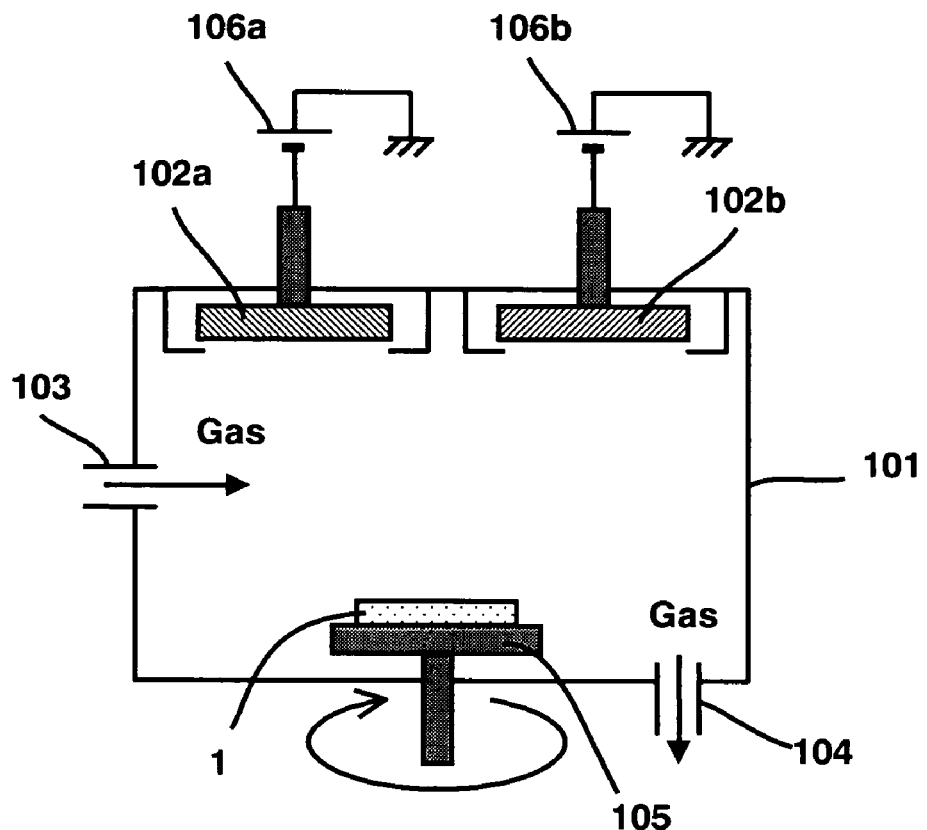
FIG. 3 is a diagram for illustrating an exemplary structure of a deposition apparatus (sputtering apparatus) used for fabricating a half-tone phase-shift mask blank according to the present invention.

FIG. 3 is a diagram for illustrating an exemplary structure of a deposition apparatus (sputtering apparatus) used for fabricating a half-tone phase-shift mask blank according to the present invention. In this drawing, reference numeral 1 denotes a transparent substrate, which is a 6-inch rectangular quartz substrate. Typically, the quartz substrate has the surface and the end face precisely polished. Reference numeral 101 denotes a chamber, reference numeral 102a denotes a first target, reference numeral 102b denotes a second target, reference numeral 103 denotes a sputtering gas inlet port, reference numeral 104 denotes a gas discharge port, reference numeral 105 denotes a substrate rotating table, and reference numerals 106a and 106b denote power supplies that apply a bias to the first and second targets, respectively.

On one principal surface of the substrate 1, a plurality of layers of a metal silicide compound containing both silicon and molybdenum, for example, are deposited to form a phase-shift multilayer film 2. The following description will be made supposing that the metal silicide compound is MoSiON.

In this case, silicon (Si) single crystal is used for the first target 102a, and molybdenum silicide (MoSi) polycrystal, which is dense and highly pure, is used for the second target 102b. The gas flow rate is set to achieve a gas pressure of 0.1 Pa in the chamber during deposition, and molybdenum silicide compound layers (MoSiON layers) are deposited while rotating the substrate 1 at 30 rpm.

Specifically, Ar gas, $O_2$ gas and $N_2$ gas are introduced as sputtering gas into the chamber 101 at predetermined flow rates to adjust the gas pressure in the chamber, predetermined discharge voltages are applied to the Si target and the $MoSi_3$ target, and then, film deposition is started with the substrate 1 rotating at 30 rpm. The voltages applied to the targets and the flow rates of the gases are determined to change stepwise for the layers of the phase-shift multilayer film as required.

Then surface treatment using ozone water or the like is performed on the top surface of the resulting phase-shift multilayer film, thereby forming a stabilized oxide layer. Furthermore, a "light-shielding film" or a "antireflection film" primarily made of a chromium metal may be formed on the stabilized oxide layer, for example.

Figure 4:
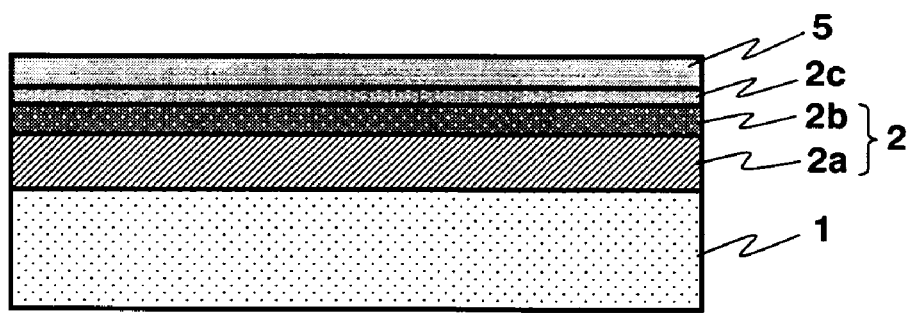
FIG. 4 is a schematic cross-sectional view showing a chromium-based light-shielding film formed on the phase-shift multilayer film according to the present invention.
Figure 5:
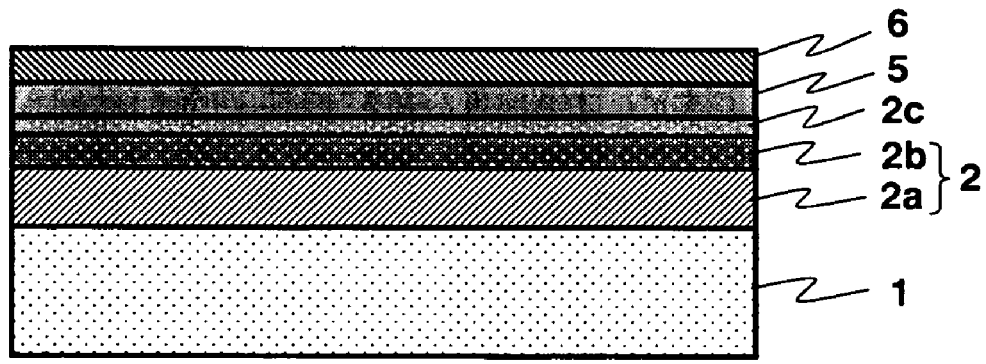
FIG. 5 is a schematic cross-sectional view showing a chromium-based antireflection film for reducing reflection from the chromium-based light-shielding film formed on the chromium-based light-shielding film.
Figure 6:
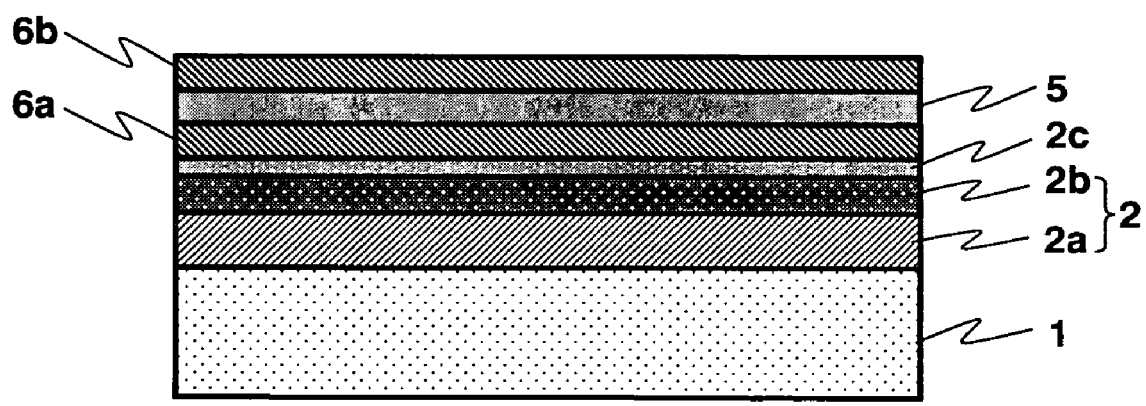
FIG. 6 is a schematic cross-sectional view showing a stack structure including a chromium-based light-shielding film sandwiched between first and second chromium-based antireflection films that is formed on the phase-shift multilayer film.

FIG. 4 is a schematic cross-sectional view showing a chromium-based light-shielding film 5 formed on a stabilized oxide layer 2c on the phase-shift multilayer film 2. FIG. 5 is a schematic cross-sectional view showing a chromium-based antireflection film 6 for reducing reflection from the chromium-based light-shielding film 5 formed on the chromium-based light-shielding film 5. Furthermore, FIG. 6 is a schematic cross-sectional view showing a stack structure including the chromium-based light-shielding film 5 sandwiched between first and second chromium-based antireflection films 6a and 6b that is formed on the stabilized oxide layer 2c.

The chromium-based light-shielding film or the chromium-based antireflection film can be deposited by reactive sputtering using a target of chromium or chromium with oxygen, nitrogen and/or carbon added thereto and a sputtering gas containing an inert gas, such as argon and krypton, and carbon dioxide gas as a carbon source.

Specifically, in the case of depositing a CrONC film, the sputtering gas introduced may be one or more of a carbon-containing gas, such as $CH_4$, $CO_2$ an CO, a nitrogen-containing gas, such as NO, $NO_2$ and $N_2$, and an oxygen-containing gas, such as $CO_2$, NO and $O_2$, or a gas mixture containing one or more of the above-described gases and an inert gas, such as Ar, Ne and Kr. In particular, $CO_2$ gas that doubles as a carbon source and an oxygen source is preferred in terms of in-plane uniformity of the substrate and controllability of the fabrication process. Of course, the various sputtering gases may be introduced separately into the chamber, or some or all of the sputtering gases may be mixed for introducing into the chamber.

Here, a CrOC film preferably contains 20 to 95 atomic % of Cr, 1 to 30 atomic % of C and 1 to 60 atomic % of O, or more preferably contains 30 to 85 atomic % of Cr, 5 to 20 atomic % of C and 5 to 50 atomic % of O. A CrONC film preferably contains 20 to 95 atomic % of Cr, 1 to 20 atomic % of C, 1 to 60 atomic % of O and 1 to 30 atomic % of N, or more preferably contains 30 to 80 atomic % of Cr, 2 to 15 atomic % of C, 5 to 50 atomic % of O and 3 to 20 atomic % of N.

The phase-shift mask according to the present invention is provided by patterning the phase-shift mask multilayer film of the phase-shift mask blank formed as described above.

Figure 7A:
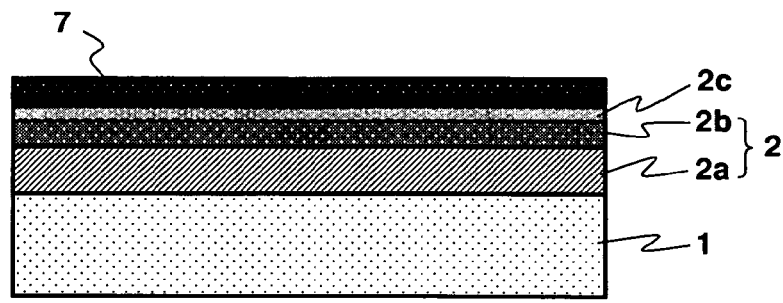
FIGS. 7A to 7D are diagrams for illustrating exemplary process steps for patterning the phase-shift mask blank according to the present invention.
Figure 7B:
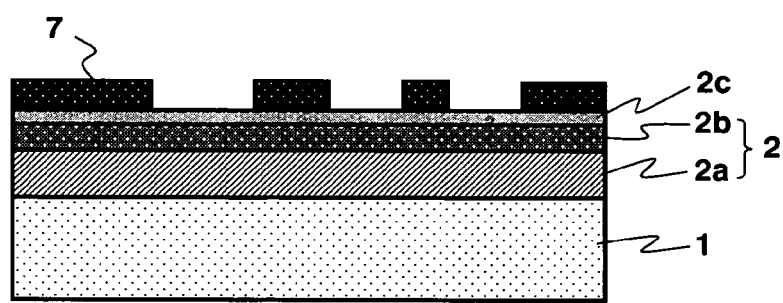
Figure 7C:
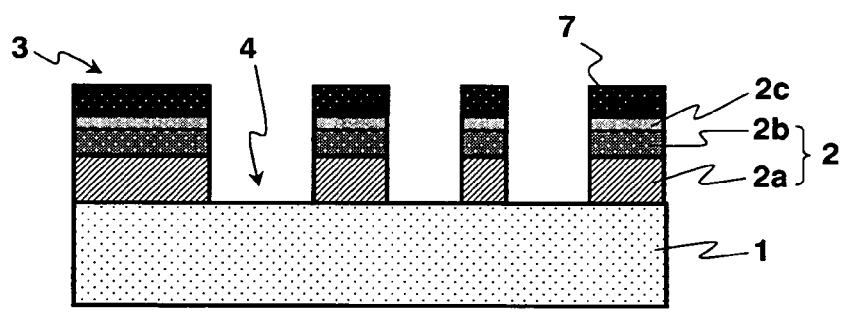

FIGS. 7A to 7D are diagrams for illustrating exemplary process steps for patterning the phase-shift mask blank according to the present invention. First, the phase-shift multilayer film 2 and the stabilized oxide layer 2c are formed on the substrate 1, and then, a resist film 7 is formed on the resulting structure (FIG. 7A). The resist film 7 is patterned by lithography (FIG. 7B), and the phase-shift multilayer film 2 is etched (FIG. 7C). The series of steps provides the phase-shifter 3 formed by the patterning and the exposed substrate part 4 resulting from the partial removal of the phase-shift multilayer film 2 by the patterning that are arranged in a desired layout.

Figure 7D:
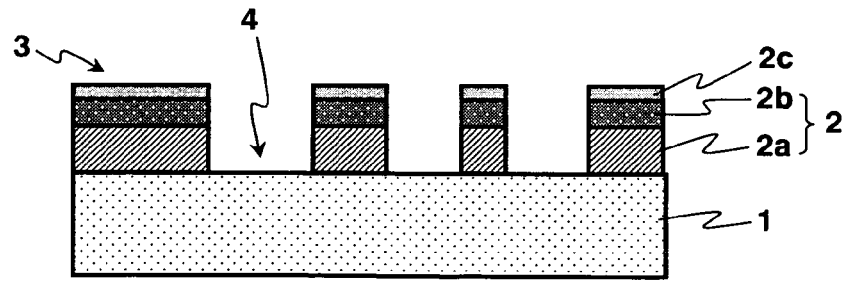

Then, finally, the remaining resist film 7 is removed to complete the patterning (FIG. 7D). The application of the resist film 7, the patterning (including exposure and development), the etching, and the removal of the resist film 7 can be performed in a well-known manner.

In the case where a chromium-based light-shielding film and/or a chromium-based antireflection film (Cr-based film) is formed on the stabilized oxide layer 2c, an area of the light-shielding film and/or the antireflection film is removed by etching as required for exposure, thereby exposing the phase-shift multilayer film 2. After that, the phase-shift multilayer film 2 can be patterned in the same manner as described above. Alternatively, the phase-shift mask may be formed by applying a resist to the top of the chromium-based film, patterning the resist, patterning the chromium-based film and the phase-shift multilayer film 2 by etching, removing only an area of the chromium-based film by selective etching as required for exposure, thereby exposing the phase-shift pattern.

In the following, the present invention will be described specifically with reference to examples.

EXAMPLE 1

First Example of Deposition Process of Phase-Shift Multilayer Film

This example relates to a deposition process of a phase-shift multilayer film of a photomask blank used for fabricating a half-tone (HT) phase-shift mask having a transmittance of 6% designed for ArF exposure.

Figure 8A:
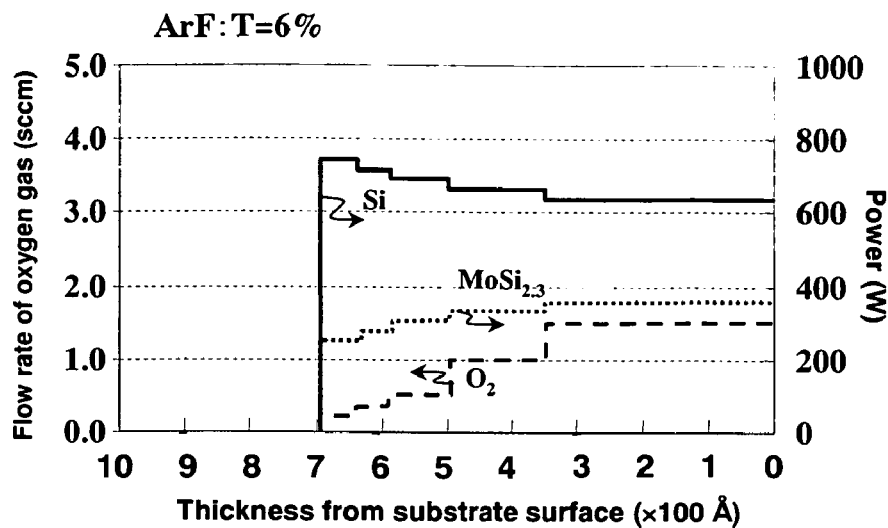
FIG. 8A is a graph for illustrating film deposition conditions in the case where the phase-shift multilayer film is composed of five MoSiON layers stacked successively.
Figure 8B:
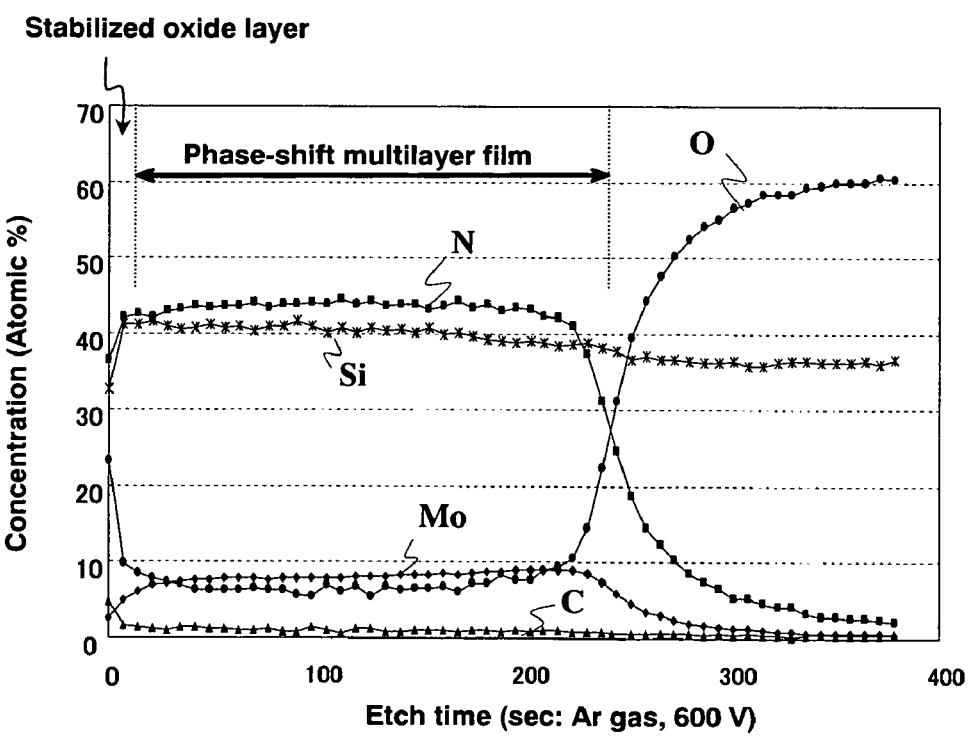
FIG. 8B is a graph for illustrating a result of X-ray photoelectron spectroscopy (XPS) analysis of the phase-shift multilayer film deposited under the conditions shown in FIG. 8A.

FIG. 8A is a graph for illustrating film deposition conditions in the case where the phase-shift multilayer film described above is composed of five MoSiON layers stacked successively, and FIG. 8B is a graph for illustrating a result of X-ray photoelectron spectroscopy (XPS) analysis of the phase-shift multilayer film deposited under the conditions.

In FIG. 8A, the horizontal axis indicates the film thickness from the substrate surface, the left vertical axis indicates the flow rate of the oxygen gas mixed with the sputtering gas, and the right vertical axis indicates the power applied to the first and second targets. In this example, Si single crystal and molybdenum silicide ($MoSi_{2.3}$) polycrystal are used for the first and second targets for sputtering, respectively. And, a gas mixture containing Ar, nitrogen and oxygen is used as the sputtering gas.

FIG. 9 is a table showing the results, in which the powers (W) applied to the first and second targets, the flow rates (sccm) of the argon, nitrogen and oxygen gases, the layer thickness (Å), and the proportion (%) of the thickness of each layer to the total film thickness are summarized.

Referring to FIGS. 8A and 9, a first layer is deposited to a thickness of 60 Å under the conditions that the power applied to the first target (Si) is 635 W, the power applied to the second target ($MoSi_{2.3}$) is 365 W, and the flow rate of the oxygen gas mixed with the sputtering gas is 1.5 sccm. Here, the flow rates of the Ar gas and the nitrogen gas mixed with the sputtering gas are 5.0 sccm and 50.0 sccm, respectively, which are not changed until the deposition of the phase-shift multilayer film is completed.

Then, a second layer is deposited on the first layer. The second layer is deposited to a thickness of 60 Å under the modified conditions that the power applied to the first target (Si) is 660 W, the power applied to the second target ($MoSi_{2.3}$) is 340 W, and the flow rate of the oxygen gas mixed with the sputtering gas is 1.0 sccm.

Then, a third layer, a fourth layer and a fifth layer are successively deposited by modifying the deposition conditions as shown in FIGS. 8A and 9, and at last, a phase-shift multilayer film having a total thickness of 700 Å is formed. Then, a surface treatment using ozone water (having an ozone concentration of 5 to 30%) is performed on the surface of the phase-shift multilayer film for 5 minutes at room temperature, thereby forming a stabilized oxide layer.

Referring to FIG. 8B, the profiles of molybdenum (Mo), silicon (Si), oxygen and nitrogen in the phase-shift multilayer film moderately change as the sputtering deposition conditions are changed, and the composition of the phase-shift multilayer film does not change abruptly.

As described earlier, the differences in molybdenum content and silicon content between an m-th layer and an (m+1)-th layer, from the substrate, in the phase-shift multilayer film are controlled to be 5 mole % or less, and the molybdenum content of the surface area of the stabilized oxide layer formed at the top surface of the phase-shift multilayer film is set to be equal to or less than one third (in molar ratio) of the metal content of the layer containing the largest amount of molybdenum (the first layer) in the phase-shift multilayer film.

The film deposition by sputtering is performed using a plurality of targets of metal silicides containing molybdenum and silicon in different ratios, and the powers applied to the targets are determined so that the differences in metal content and silicon content between an m-th layer from the substrate in the phase-shift multilayer film and an (m+1)-th layer are both equal to or less than 5 mole %, and the powers are equal to or less than 30% of the maximum power applied to the respective targets.

Furthermore, the oxygen content of the sputtering gas is set so that the difference between the oxygen content during deposition of an m-th layer from the substrate in the phase-shift multilayer film and the oxygen content during deposition of an (m+1)-th layer is 5 mole % or less. The multilayer film contains a slight amount of carbon (C), which is not mixed by design but is due to contamination by carbon impurities or the like left in the sputtering chamber.

In order to check the chemical resistance of the phase-shift multilayer film according to the present invention provided as described above, the phase-shift multilayer film was immersed in a controlled solution (at 25 degrees Celsius) containing ammonia water, hydrogen peroxide and water in a volume ratio of 1:1:8 for one hour, and then, the change of transmittance was measured (measurement wavelength: 193 nm). A film having high chemical resistance is expected not to change significantly before and after it is immersed in the chemical solution. The phase-shift multilayer film according to the present invention exhibited a transmittance change of only 0.1% and therefore was proven to have high chemical resistance.

EXAMPLE 2

Second Example of Deposition Process of Phase-Shift Multilayer Film

This example relates to a deposition process of a phase-shift multilayer film of a photomask blank used for fabricating a half-tone (HT) phase-shift mask having a transmittance of 6% designed for KrF exposure.

Figure 10A:
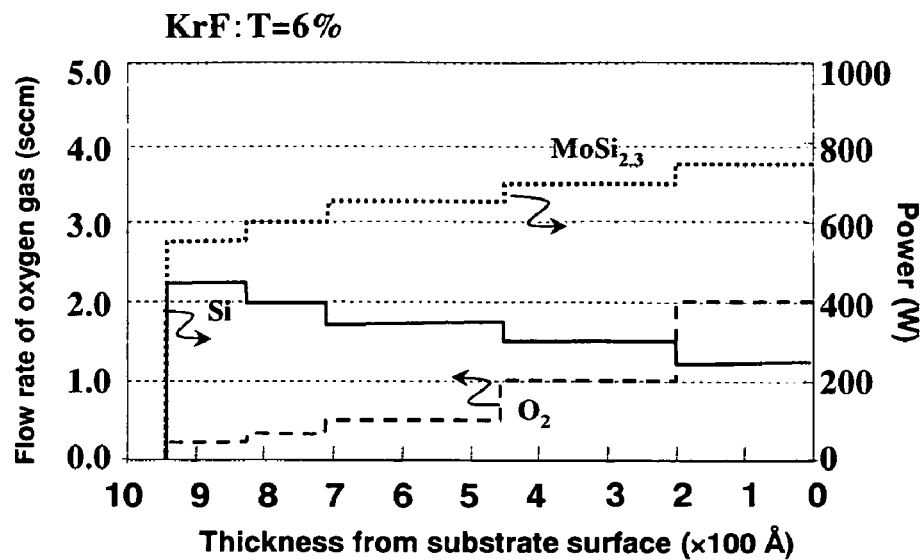
FIG. 10A is a graph for illustrating film deposition conditions in the case where the phase-shift multilayer film described above is composed of five MoSiON layers stacked successively.
Figure 10B:
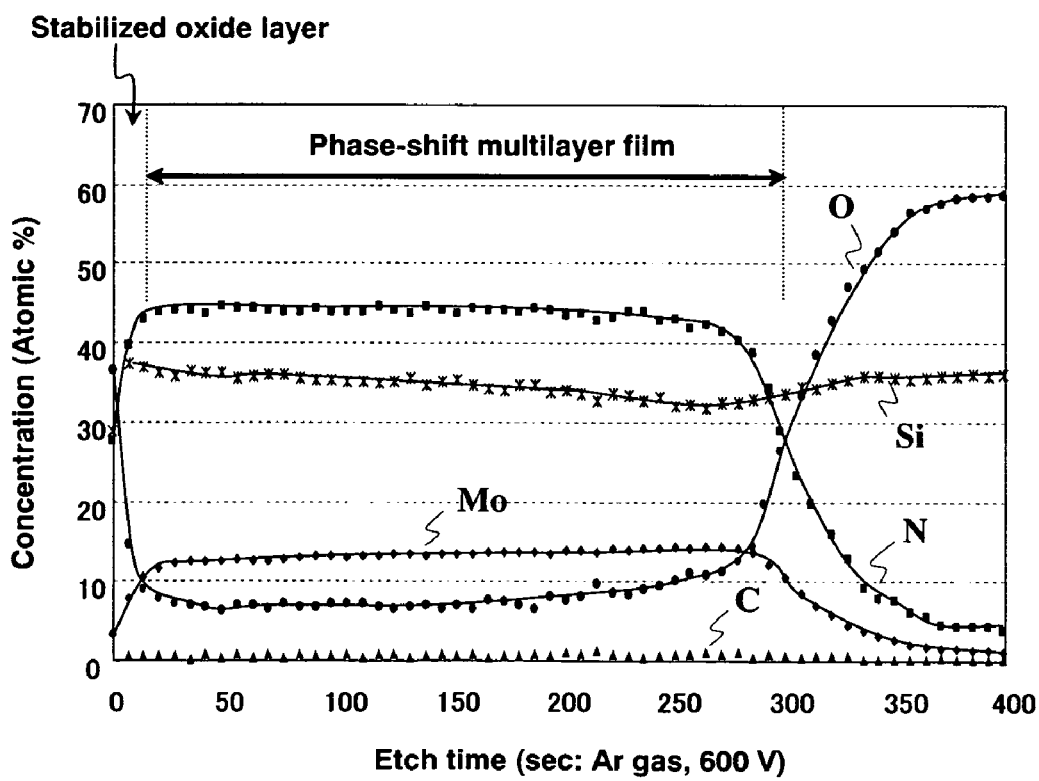
FIG. 10B is a graph for illustrating a result of X-ray photoelectron spectroscopy (XPS) analysis of the phase-shift multilayer film deposited under the conditions shown in FIG. 10A.

FIG. 10A is a graph for illustrating film deposition conditions in the case where the phase-shift multilayer film described above is composed of five MoSiON layers stacked successively, and FIG. 10B is a graph for illustrating a result of X-ray photoelectron spectroscopy (XPS) analysis of the phase-shift multilayer film deposited under the conditions.

In FIG. 10A, the horizontal axis indicates the film thickness from the substrate surface, the left vertical axis indicates the flow rate of the oxygen gas mixed with the sputtering gas, and the right vertical axis indicates the power applied to the first and second targets. In this example, Si single crystal and molybdenum silicide ($MoSi_{2.3}$) polycrystal are used for the first and second targets for sputtering, respectively. And, a gas mixture containing Ar, nitrogen and oxygen is used as the sputtering gas.

FIG. 11 is a table showing the results, in which the powers (W) applied to the first and second targets, the flow rates (sccm) of the argon, nitrogen and oxygen gases, the layer thickness (Å), and the proportion (%) of the thickness of each layer to the total film thickness are summarized.

Referring to FIGS. 10A and 11, a first layer is deposited to a thickness of 200 Å under the conditions that the power applied to the first target (Si) is 250 W, the power applied to the second target ($MoSi_{2.3}$) is 750 W, and the flow rate of the oxygen gas mixed with the sputtering gas is 2.0 sccm. Here, the flow rates of the Ar gas and the nitrogen gas mixed with the sputtering gas are 5.0 sccm and 50.0 sccm, respectively, which are not changed until the deposition of the phase-shift multilayer film is completed.

Then, a second layer is deposited on the first layer. The power applied to the first target (Si) is changed to 300 W, the power applied to the second target ($MoSi_{2.3}$) is changed to 700 W, and the flow rate of the oxygen gas mixed with the sputtering gas is changed to 1.0 sccm. Under these conditions, the second layer is deposited to a thickness of 250 Å.

Then, a third layer is deposited on the second layer. The third layer is deposited to a thickness of 250 Å under the conditions that the power applied to the first target (Si) is 350 W, the power applied to the second target ($MoSi_{2.3}$) is 650 W, and the flow rate of the oxygen gas mixed with the sputtering gas is 0.5 sccm.

Then, a fourth layer and a fifth layer are successively deposited by modifying the deposition condition as shown in FIGS. 10A and 11, and at last, a phase-shift multilayer film having a total thickness of 938 Å is formed. Then, a surface treatment using ozone water (having an ozone concentration of 5 to 30%) is performed on the surface of the phase-shift multilayer film for 5 minutes at room temperature, thereby forming a stabilized oxide layer.

Referring to FIG. 10B, the profiles of molybdenum (Mo), silicon (Si), oxygen and nitrogen in the phase-shift multilayer film moderately change as the deposition conditions are changed, and the composition of the phase-shift multilayer film does not change abruptly.

As described earlier, the differences in molybdenum content and silicon content between an m-th layer and an (m+1)-th layer, from the substrate, in the phase-shift multilayer film are controlled to be 5 mole % or less, and the molybdenum content of the surface area of the stabilized oxide layer formed at the top surface of the phase-shift multilayer film is set to be equal to or less than one third (in molar ratio) of the metal content of the layer containing the largest amount of molybdenum in the phase-shift multilayer film.

The film deposition by sputtering is performed using a plurality of targets of metal silicides containing molybdenum and silicon in different ratios, and the powers applied to the targets are determined so that the differences in metal content and silicon content between an m-th layer from the substrate in the phase-shift multilayer film and an (m+1)-th layer are both equal to or less than 5 mole %, and the powers are equal to or less than 30% of the maximum power applied to the respective targets.

Furthermore, the oxygen content of the sputtering gas is set so that the difference between the oxygen content during deposition of an m-th layer from the substrate in the phase-shift multilayer film and the oxygen content during deposition of an (m+1)-th layer is 5 mole % or less. The multilayer film contains a slight amount of carbon (C), which is not mixed by design but is due to contamination by carbon impurities or the like left in the sputtering chamber.

In order to check the chemical resistance of the phase-shift multilayer film according to the present invention provided as described above, the phase-shift multilayer film was immersed in a controlled solution (at 25 degrees Celsius) containing ammonia water, hydrogen peroxide and water in a volume ratio of 1:1:8 for one hour, and then, the change of transmittance was measured (measurement wavelength: 248 nm). A film having high chemical resistance is expected not to change significantly before and after it is immersed in the chemical solution. The phase-shift multilayer film according to the present invention exhibited a transmittance change of only 0.1% and therefore was proven to have high chemical resistance.

COMPARATIVE EXAMPLE

Figure 12A:
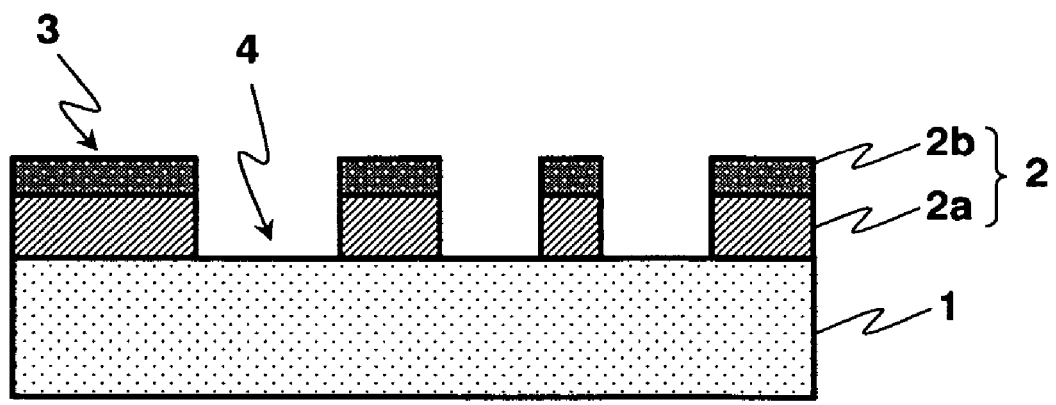
FIGS. 12A and 12B are diagrams for illustrating a side wall of a phase-shift multilayer film comprising a stack of two layers according to the present invention that is patterned by dry etching.
Figure 12B:
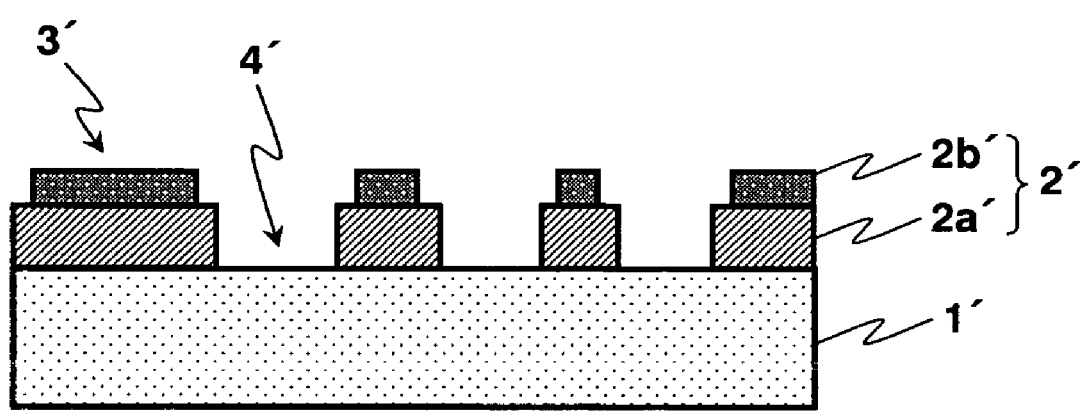

FIGS. 12A and 12B are diagrams for illustrating a side wall of a phase-shift multilayer film comprising a stack of two layers according to the present invention that is patterned by dry etching. FIG. 12A is a schematic cross-sectional view of a phase-shift multilayer film according to the present invention whose composition is controlled, and FIG. 12B is a cross-sectional view of a phase-shift multilayer film whose composition is not controlled (in FIG. 12B, parts corresponding to those shown in FIG. 12A are denoted by the same reference numerals with a dash (')).

If a phase-shift multilayer film (2') comprising a lower layer (2a') and an upper layer (2b') having significantly different compositions is etched, the etch rates of the layers are remarkably different, and thus, the etch rate abruptly changes at the interface between the upper layer and the lower layer. As a result, a remarkable bump is produced, and the roughness of the side wall increases (FIG. 12B). To the contrary, if the deposition conditions for the layers constituting the phase-shift film are moderately changed stepwise as in the present invention, the etch rate moderately changes at the interface between the two layers (2a, 2b), and thus, the side wall is smoothed (FIG. 12A).

While a phase-shift mask blank and a phase-shift mask fabricated using the phase-shift mask blank according to the present invention have been described with reference to examples, these examples are intended only for illustrating the present invention, and the present invention is not limited thereto. It will be apparent from the above description that these examples can be modified in various ways within the scope of the present invention, and other various examples are possible within the scope of the present invention.

The present invention provides a phase-shift mask blank that has a high chemical resistance while meeting requirements of optical properties, is improved in smoothness (reduced in roughness) of an end face (side wall) of a patterned part resulting from etching of a phase-shift film and can stably and precisely transfer a fine pattern, and a phase-shift mask fabricated using the mask blank.

What is claimed is:

1. A phase-shift mask blank comprising:
   a phase-shift multilayer film including a stack of n layers made of a metal silicide compound; and
   a stabilized oxide layer formed at the top surface of the phase-shift multilayer film,
   wherein the differences in metal content and silicon content between an m-th layer from a substrate in said phase-shift multilayer film and an (m+1)-th layer are both equal to or less than 5 mole %, and the metal content of a surface area of said stabilized oxide layer is equal to or less than one third (in molar ratio) of the metal content of a layer containing the largest amount of metal in said phase-shift multilayer film (where n is an integer equal to or more than 2, and m is an integer falling within a range of $1 \leq m \leq (n-1)$).

2. The phase-shift mask blank according to claim 1, wherein the surface region of said stabilized oxide layer has a metal molar content lower than the minimum metal molar content in said phase-shift multilayer film and an oxygen molar content higher than the maximum oxygen molar content in said phase-shift multilayer film, and the lowermost layer in said phase-shift multilayer film has the maximum metal molar content in said phase-shift multilayer film.

3. The phase-shift mask blank according to claim 1, wherein said metal silicide compound is any of an oxide, a nitride, a carbide, an oxynitride, an oxycarbide, a nitride carbide, or an oxynitride carbide of a metal silicide.

4. A phase-shift mask formed by patterning a phase-shift multilayer film of a phase-shift mask blank according to claim 1.

5. The phase-shift mask blank according to claim 3, wherein the surface region of said stabilized oxide layer has a metal molar content lower than the minimum metal molar content in said phase-shift multilayer film and an oxygen molar content higher than the maximum oxygen molar content in said phase-shift multilayer film, and the lowermost layer in said phase-shift multilayer film has the maximum metal molar content in said phase-shift multilayer film.

6. The phase-shift mask blank according to claim 1, wherein said metal silicide is molybdenum silicide.

7. The phase-shift mask blank according to claim 6, wherein the surface region of said stabilized oxide layer has a metal molar content lower than the minimum metal molar content in said phase-shift multilayer film and an oxygen content higher than the maximum oxygen molar content in said phase-shift multilayer film, and the lowermost layer in said phase-shift multilayer film has the maximum metal molar content in said phase-shift multilayer film.

8. The phase-shift mask blank according to claim 3, wherein said metal silicide is molybdenum silicide.

9. The phase-shift mask blank according to claim 8, wherein the surface region of said stabilized oxide layer has a metal molar content lower than the minimum metal molar content in said phase-shift multilayer film and an oxygen molar content higher than the maximum oxygen molar content in said phase-shift multilayer film, and the lowermost layer in said phase-shift multilayer film has the maximum metal molar content in said phase-shift multilayer film.

10. A phase-shift mask formed by patterning a phase-shift multilayer film of a phase-shift mask blank according to claim 3.

11. A method of fabricating a phase-shift mask blank, comprising:
    depositing a phase-shift multilayer film including a stack of n layers made of a metal silicide compound on a substrate by sputtering; and
    performing an oxidation processing on the top surface of said phase-shift multilayer film to form a stabilized oxide layer,
    wherein said film deposition by sputtering is performed using power applied to a plurality of targets of different compositions of a metal and silicon constituting said metal silicide, and the power applied to each of said plurality of targets is determined in such a manner that the differences in metal content and silicon content between an m-th layer from the substrate in the phase-shift multilayer film and an (m+1)-th layer are both equal to or less than 5 mole %, and the differences in power applied to the plurality of targets between an m-th layer from the substrate in the phase-shift multilayer film and an (m+1)-th layer are equal to or less than 30% of the maximum of the power applied to the plurality of targets, and
    said oxidation processing is performed in such a manner that the metal content of a surface area of said stabilized oxide layer is equal to or less than one third (in molar ratio) of the metal content of a layer containing the largest amount of metal in said phase-shift multilayer film (where n is an integer equal to or more than 2, and m is an integer falling within a range of $1 \leq m \leq (n-1)$).

12. The method of fabricating a phase-shift mask blank according to claim 11, wherein said film deposition by sputtering is performed using a sputtering gas containing oxygen, and the oxygen content in the sputtering gas is determined in such a manner that the lowermost layer in said phase-shift multilayer film has the maximum metal molar content in said phase-shift multilayer film, and
    said oxidation processing is performed in such a manner that the surface region of said stabilized oxide layer has a metal molar content lower than the minimum metal molar content in said phase-shift multilayer film and an oxygen molar content higher than the maximum oxygen molar content in said phase-shift multilayer film.

13. The method of fabricating a phase-shift mask blank according to claim 11, wherein a metal silicide target and a silicon target are selected as said plurality of targets.

14. The method of fabricating a phase-shift mask blank according to claim 11, wherein said film deposition by sputtering is performed using a sputtering gas containing oxygen or nitrogen, and the oxygen or nitrogen content in the sputtering gas is determined in such a manner that the difference between the content during deposition of an m-th layer from the substrate in said phase-shift multilayer film and the content during deposition of an (m+1)-th layer is 5 mole % or less.

15. The method of fabricating a phase-shift mask blank according to claim 14, wherein said film deposition by sputtering is performed using a sputtering gas containing oxygen, and the oxygen content in the sputtering gas is determined in such a manner that the lowermost layer in said phase-shift multilayer film has the maximum metal molar content in said phase-shift multilayer film, and
    said oxidation processing is performed in such a manner that the surface region of said stabilized oxide layer has a metal molar content lower than the minimum metal molar content in said phase-shift multilayer film and an oxygen molar content higher than the maximum oxygen molar content in said phase-shift multilayer film.

16. The method of fabricating a phase-shift mask blank according to claim 13, wherein said metal silicide target contains molybdenum as a metal constituent.

17. The method of fabricating a phase-shift mask blank according to claim 13, wherein said film deposition by sputtering is performed using a sputtering gas containing oxygen or nitrogen, and the oxygen or nitrogen content in the sputtering gas is determined in such a manner that the difference between the content during deposition of an m-th layer from the substrate in said phase-shift multilayer film and the content during deposition of an (m+1)-th layer is 5 mole % or less.

18. The method of fabricating a phase-shift mask blank according to claim 13, wherein said film deposition by sputtering is performed using a sputtering gas containing oxygen, and the oxygen content in the sputtering gas is determined in such a manner that the lowermost layer in said phase-shift multilayer film has the maximum metal molar content in said phase-shift multilayer film, and said oxidation processing is performed in such a manner that the surface region of said stabilized oxide layer has a metal molar content lower than the minimum metal molar content in said phase-shift multilayer film and an oxygen molar content higher than the maximum oxygen content in said phase-shift multilayer film.

19. The method of fabricating a phase-shift mask blank according to claim 16, wherein said film deposition by sputtering is performed using a sputtering gas containing oxygen or nitrogen, and the oxygen or nitrogen content in the sputtering gas is determined in such a manner that the difference between the content during deposition of an m-th layer from the substrate in said phase-shift multilayer film and the content during deposition of an (m+1)-th layer is 5 mole % or less.

20. The method of fabricating a phase-shift mask blank according to claim 16, wherein said film deposition by sputtering is performed using a sputtering gas containing oxygen, and the oxygen content in the sputtering gas is determined in such a manner that the lowermost layer in said phase-shift multilayer film has the maximum metal content in said phase-shift multilayer film, and said oxidation processing is performed in such a manner that the surface region of said stabilized oxide layer has a metal molar content lower than the minimum metal molar content in said phase-shift multilayer film and an oxygen molar content higher than the maximum oxygen molar content in said phase-shift multilayer film.

* * * * *